(12) United States Patent
Wright

(10) Patent No.: US 7,208,810 B2
(45) Date of Patent: Apr. 24, 2007

(54) INTEGRATED MIS PHOTOSENSITIVE DEVICE USING CONTINUOUS FILMS

(75) Inventor: Michael Dean Wright, Palo Alto, CA (US)

(73) Assignee: Varian Medical Technologies, Inc., Palo Alto, CA (US)

( * ) Notice: Subject to any disclaimer, the term of this patent is extended or adjusted under 35 U.S.C. 154(b) by 378 days.

(21) Appl. No.: 10/882,603

(22) Filed: Jul. 1, 2004

(65) Prior Publication Data

US 2006/0001120 A1 Jan. 5, 2006

(51) Int. Cl.
*H01L 31/00* (2006.01)

(52) U.S. Cl. .................. 257/444; 257/292; 257/459; 257/E27.133

(58) Field of Classification Search ............. 257/444, 257/446, 452, 462, 292, E27.133
See application file for complete search history.

(56) References Cited

U.S. PATENT DOCUMENTS

| | | | |
|---|---|---|---|
| 4,435,610 A * | 3/1984 | Perlman et al. | 136/255 |
| 6,075,256 A | 6/2000 | Kaifu et al. | |
| 6,242,746 B1 * | 6/2001 | Teranuma et al. | 250/370.13 |
| 6,271,880 B1 | 8/2001 | Kameshima et al. | |
| 6,340,818 B1 * | 1/2002 | Izumi et al. | 250/370.13 |
| 6,512,217 B1 | 1/2003 | Kameshima | |
| 6,512,279 B2 | 1/2003 | Kaifu et al. | |
| 6,710,370 B2 | 3/2004 | Street et al. | |
| 6,816,355 B2 * | 11/2004 | Watanabe | 361/306.3 |

2001/0050402 A1 12/2001 Kaifu et al.

OTHER PUBLICATIONS

Kameshima, T., Kaifu, N., Takami, E., Morishita, M., and Yamazaki, T., "Novel Large Area MIS-type X-ray Image Sensor for Digital Radiography," SPIE Conference on Physics of Medical Imaging, SPIE vol. 3336, pp. 453-462, Feb. 1998.

Mulato, M., Ready, S., Van Schuylenbergh, K., Lu, J.P., and Street, R.A., "Crosstalk adn Lateral Conduction Effects in Continuous-Sensor Amorphous Silicon Imagers," Journal of Applied Physics, vol. 89, No. 12, pp. 8193-8201, Jun. 2001.

Mulato, M., Lemmi, F., Lau, R., Lu, J.P., Ho, J., Ready, S.E., Rahn, J.T., and Street, R.A., "Charge Collection and Capacitance in Continuous film Flat Panel Detectors," SPIE Conference on Physics of Medical Imaging, SPIE vol. 3977, pp. 26-37, Feb. 2000.

Sze, S.M., "Basic CCD Structure," in Physics of Semiconductor Devices, 2nd ed., New York: John Wiley & Sons, 1981, pp. 412-416.

Fossum, E. R., "CMOS Image Sensors: Electronic Camera-On-A-Chip," IEEE Transaction on Electron Devices, vol. 44, No. 10, pp. 1689-1698, Oct. 1997.

Karim, K. S., Nathan, A., and Rowlands, J. A., "Alternate Pixel Architectures for Large Area Medical Imaging," SPIE Conference on Physics of Medical Imaging, SPIE vol. 4320, pp. 35-46, Feb. 2001.

* cited by examiner

*Primary Examiner*—T. N. Quach
(74) *Attorney, Agent, or Firm*—Vedder, Price, Kaufman & Kammholz, P.C.

(57) ABSTRACT

An integrated photosensitive device with a metal-insulator-semiconductor (MIS) photodiode constructed with one or more substantially continuous layers of semiconductor material and with a substantially continuous layer of dielectric material.

52 Claims, 14 Drawing Sheets

INTEGRATED MIS PHOTOSENSITIVE DEVICE USING CONTINUOUS FILMS

BACKGROUND OF THE INVENTION

1. Field of the Invention

The present invention relates to image sensors, and in particular, to image sensors with pixel circuits implemented with metal-insulator-semiconductor (MIS) photodiodes.

2. Description of the Related Art

Image sensors, such as those used for large area X-ray imaging, often use pixel circuits in which a mesa-isolated MIS photodiode is used as the photosensitive device. (A mesa-isolated device is formed by etching away a portion of the active materials, leaving a "mesa" of active materials.) Another common photosensitive device is a mesa-isolated p-i-n photodiode. Yet another conventional photosensitive device is a p-i-n photodiode comprised substantially of continuous films. However, such conventional photosensitive devices have disadvantages. Both the mesa-isolated MIS and p-i-n photodiodes typically generate poor image signals. The p-i-n photodiode comprised substantially of continuous films exhibits significant crosstalk among adjacent pixels.

Referring to FIG. 1, a conventional embodiment 10a of a pixel circuit implemented with a mesa-isolated MIS photodiode and a thin-film transistor (TFT) is typically integrated as shown. Starting with a substrate 12, various layers of dielectric (insulator), semiconductor and conductive materials are formed (e.g., deposited). For example, on the top surface of the substrate 12, a patterned layer of conductive material (e.g., metal) forms the bottom electrode 20a of the MIS photodiode 14a and the gate terminal 32 of the TFT 16. Next is a patterned layer of dielectric material which forms the dielectric 26a of the MIS photodiode 14a and the gate dielectric 34 of the TFT 16. Next is a patterned layer of intrinsic amorphous silicon (i a-Si) material which forms one of the semiconductor layers 24a, the light absorbing layer, of the MIS photodiode 14a and the channel 36 of the TFT 16. Next is a patterned layer of n+ amorphous silicon which forms the remaining semiconductor layer, the ohmic contact 22a, and, effectively, the top electrode of the MIS photodiode 14a and ohmic contacts 38 for the drain and source terminals of the TFT 16. Next is another patterned conductive layer (e.g., metal) which forms the drain 42 and source 44 terminals of the TFT 16, the data line 46, and the bias line 30. Following all of this is a layer of passivation (dielectric) 50.

Referring to FIG. 2, another embodiment 10b of a conventional pixel circuit uses a mesa-isolated p-i-n photodiode 14b instead of a mesa-isolated MIS photodiode. In this embodiment 10b, the structure of the TFT 16 is substantially the same as the embodiment 10a of FIG. 1. In place of the MIS photodiode 14a, however, a p-i-n photodiode 14b is used. The patterned layer of conductive material (e.g., metal) forming the source terminal 44 of the TFT 16 also forms the bottom electrode 20b of the p-i-n photodiode 14b. Next is a patterned layer of n+ amorphous silicon 28b, followed by a patterned layer of intrinsic amorphous silicon 24b, the light absorbing layer, and then a patterned layer of p+amorphous silicon 22b which together form the p-i-n structure of the photodiode 14b. Next is a patterned layer of optically transparent conductive material (e.g., indium tin oxide, or ITO) which forms the top electrode 18b. Next is a patterned layer of dielectric material which forms an interlayer dielectric 52, through which a via is formed to allow conductive material (e.g., metal) to be deposited to form the bias line 30 in contact with the top electrode 18b of the photodiode 14b. Lastly is a layer of passivation 50.

Referring to FIG. 3, an alternative embodiment 10c of a conventional pixel circuit using a p-i-n photodiode 14c is similar to the embodiment 10b of FIG. 2, except that a substantial portion of the photodiode 14c is formed by using continuous films, as opposed to being formed in a mesa-isolated structure. Accordingly, the fabrication and materials used for the various photodiode layers 24c, 22c and 18c are the same, but in a continuous film.

As noted above, a disadvantage common to mesa-isolated MIS and p-i-n photodiode sensors is low signal levels. With a mesa-isolated structure, such photosensitive elements have fill-factors less than unity (fill-factor is defined as the area of the photosensitive element divided by the overall pixel area). Hence, not all of the light impinging upon the pixel is absorbed by the photosensitive element. Accordingly, maximum possible signal strength cannot be achieved.

The mesa-isolated MIS photodiode structure of FIG. 1 has a further disadvantage. The same film that is used to form the channel 36 of the TFT 16 is also used to form the light absorbing layer 24a of the MIS photodiode 14a. Generally, TFT 16 performance is optimized when the channel 36 thickness is thin, while MIS photodiode 14a performance is optimized when the light absorbing layer 24a is thick. With a single film, the performance of one or both of the TFT 16 and MIS photodiode 14a may suffer as the chosen film thickness may not be optimum for one or both.

With respect to signal strength, the p-i-n photodiode 14c formed substantially of continuous films, as shown in the embodiment 10c of FIG. 3, has improved signal strength. With this photosensitive element having a near unity fill-factor, nearly maximum signal strength can be achieved. However, this structure can suffer from significant crosstalk between adjacent pixels. For example, the interface 54 between the interlayer dielectric 52 and the light absorption layer 24c can have a nonzero conductance. Accordingly, potential differences between the bottom electrodes 20c of adjacent pixels produce small currents between such pixels, i.e., crosstalk.

SUMMARY OF THE INVENTION

An integrated photosensitive device with a metal-insulator-semiconductor (MIS) photodiode constructed with one or more substantially continuous layers of semiconductor material and with a substantially continuous layer of dielectric material.

In accordance with one embodiment of the presently claimed invention, an integrated photosensitive device includes a substrate and a metal-insulator-semiconductor (MIS) photodiode at least a portion of which is disposed over the substrate. The MIS photodiode includes: first and second electrodes; one or more dielectrics at least a portion of at least one of which is disposed between the first and second electrodes, wherein at least one of the one or more dielectric portions comprises a respective substantially continuous layer of dielectric material; one or more semiconductors at least a portion of at least one of which is disposed between one of the one or more dielectrics and one of the first and second electrodes, wherein at least one of the one or more semiconductor portions comprises a respective substantially continuous layer of semiconductor material; and a third electrode substantially bordering one of the first and second electrodes.

In accordance with another embodiment of the presently claimed invention, an integrated photosensitive device includes a substrate and a metal-insulator-semiconductor (MIS) photodiode at least a portion of which is disposed over the substrate. The MIS photodiode includes: a plurality of conduction layers including at least first and second conduction layers comprising first and second films of conductive material, respectively; one or more insulation layers at least a portion of at least one of which is disposed between the first and second conduction layers, wherein at least one of the one or more insulation layer portions comprises a respective substantially continuous film of insulation material; and one or more semiconductor layers at least a portion of at least one of which is disposed between one of the one or more insulation layers and one of the first and second conduction layers, wherein at least one of the one or more semiconductor layer portions comprises a respective substantially continuous film of semiconductor material; wherein one of the first and second conduction layers includes a first portion, one of the plurality of conduction layers includes a second portion, the first and second portions are mutually isolated, and the first portion is substantially bordered by the second portion.

In accordance with another embodiment of the presently claimed invention, an integrated photosensitive array includes a substrate and a plurality of metal-insulator-semiconductor (MIS) photodiodes at least a portion of which is disposed in an array over the substrate. Each one of the at least a portion of the plurality of MIS photodiodes includes: first and second electrodes; one or more dielectrics at least a portion of at least one of which is disposed between the first and second electrodes, wherein at least one of the one or more dielectric portions comprises a respective substantially continuous layer of dielectric material; one or more semiconductors at least a portion of at least one of which is disposed between one of the one or more dielectrics and one of the first and second electrodes, wherein at least one of the one or more semiconductor portions comprises a respective substantially continuous layer of semiconductor material; and a third electrode substantially bordering one of the first and second electrodes.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Figure 4:
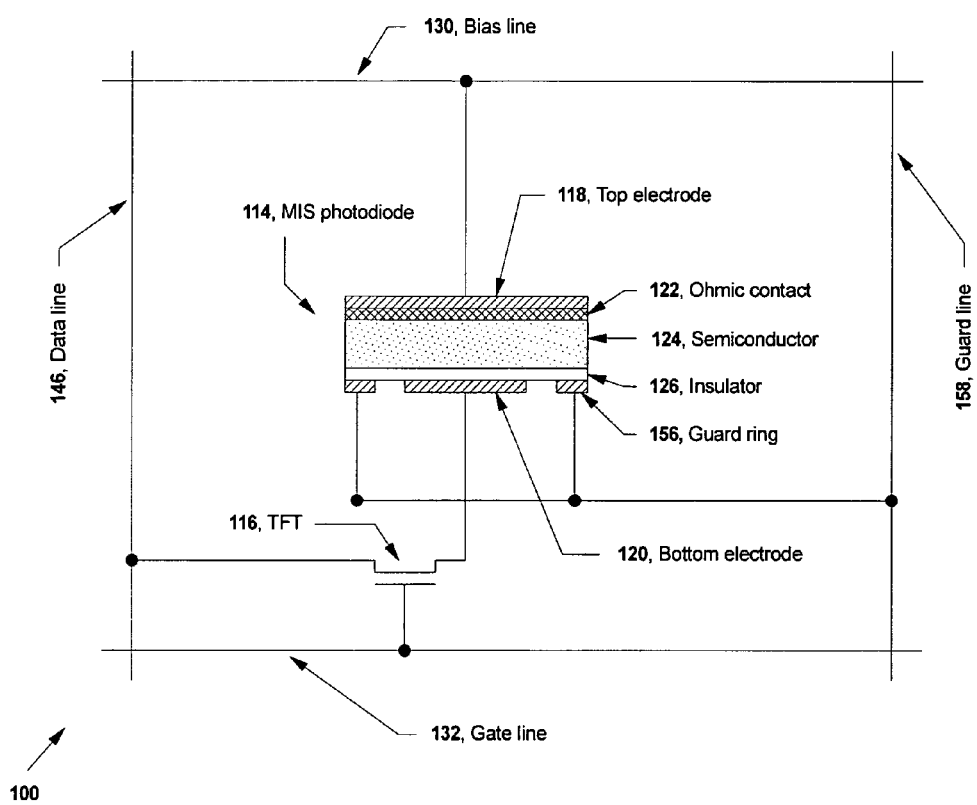
FIG. 4 is a schematic diagram of a pixel circuit in accordance with one embodiment of the presently claimed invention.

Referring to FIG. 4, a pixel circuit 100 in accordance with one embodiment of the presently claimed invention includes the MIS photodiode 114 and a TFT 116 connected to a bias line 130, gate line 132 and data line 146, all in accordance with well known pixel circuit techniques. The MIS photodiode 114 includes an optically transparent top electrode 118 and a bottom electrode 120, between which are the semiconductor layers 122, 124 and insulator 126 in a vertical relationship as shown. Additionally, however, the bottom electrode 120 is bordered by a guard ring 156 connected to a guard line 158 through which a voltage is applied to inhibit crosstalk between adjacent pixels (discussed in more detail below).

Figure 5:
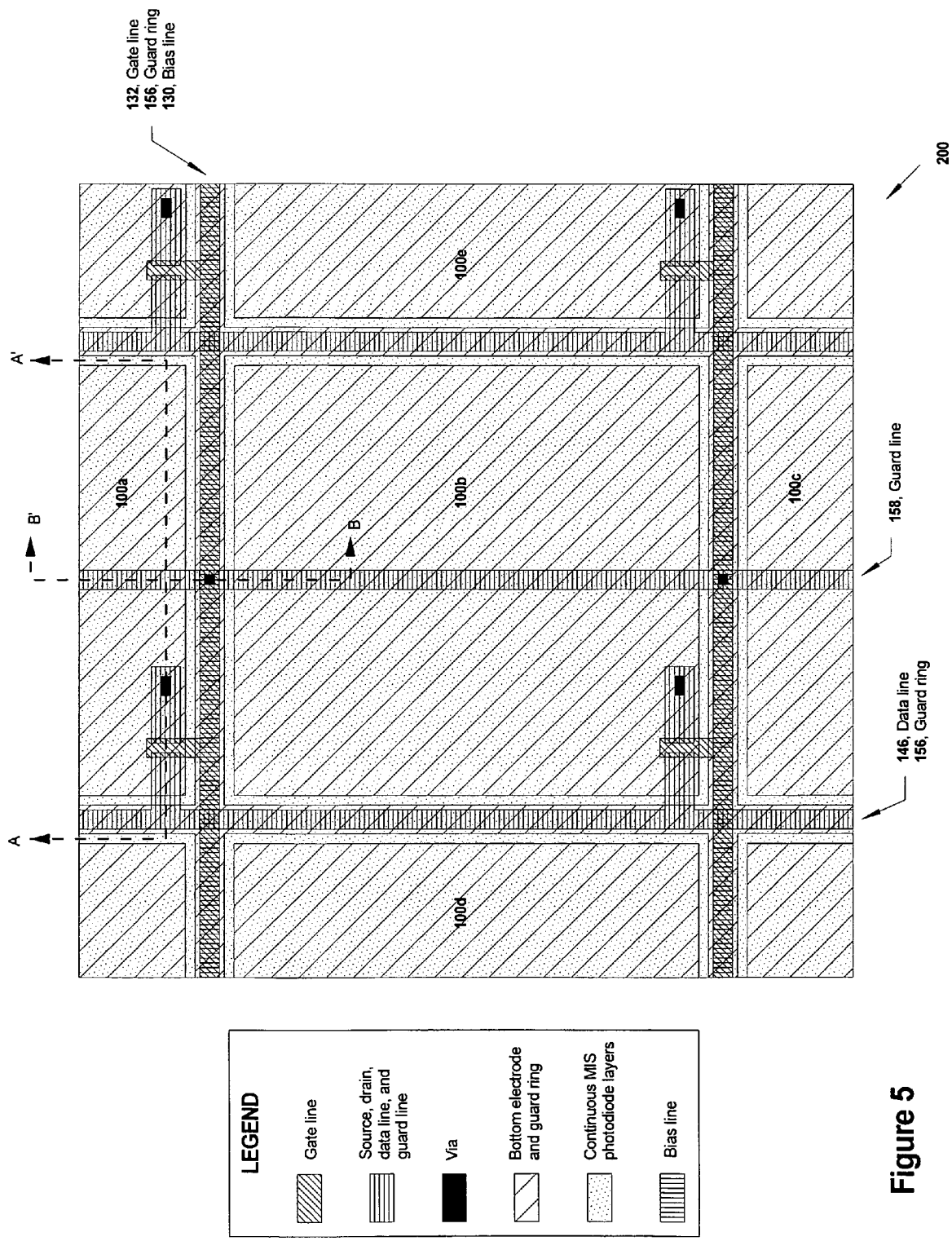
FIG. 5 is a plan view of a portion of an integrated circuit containing pixel circuits corresponding to the schematic of FIG. 4.

Referring to FIG. 5, a plan view of a portion 200 of an integrated circuit containing pixel circuits implemented according to the pixel circuit 100 of FIG. 4 illustrates a pixel circuit 100b with adjacent pixel circuits 100a, 100c, 100d, 100e above, below, to the left and to the right, respectively.

Figure 1:
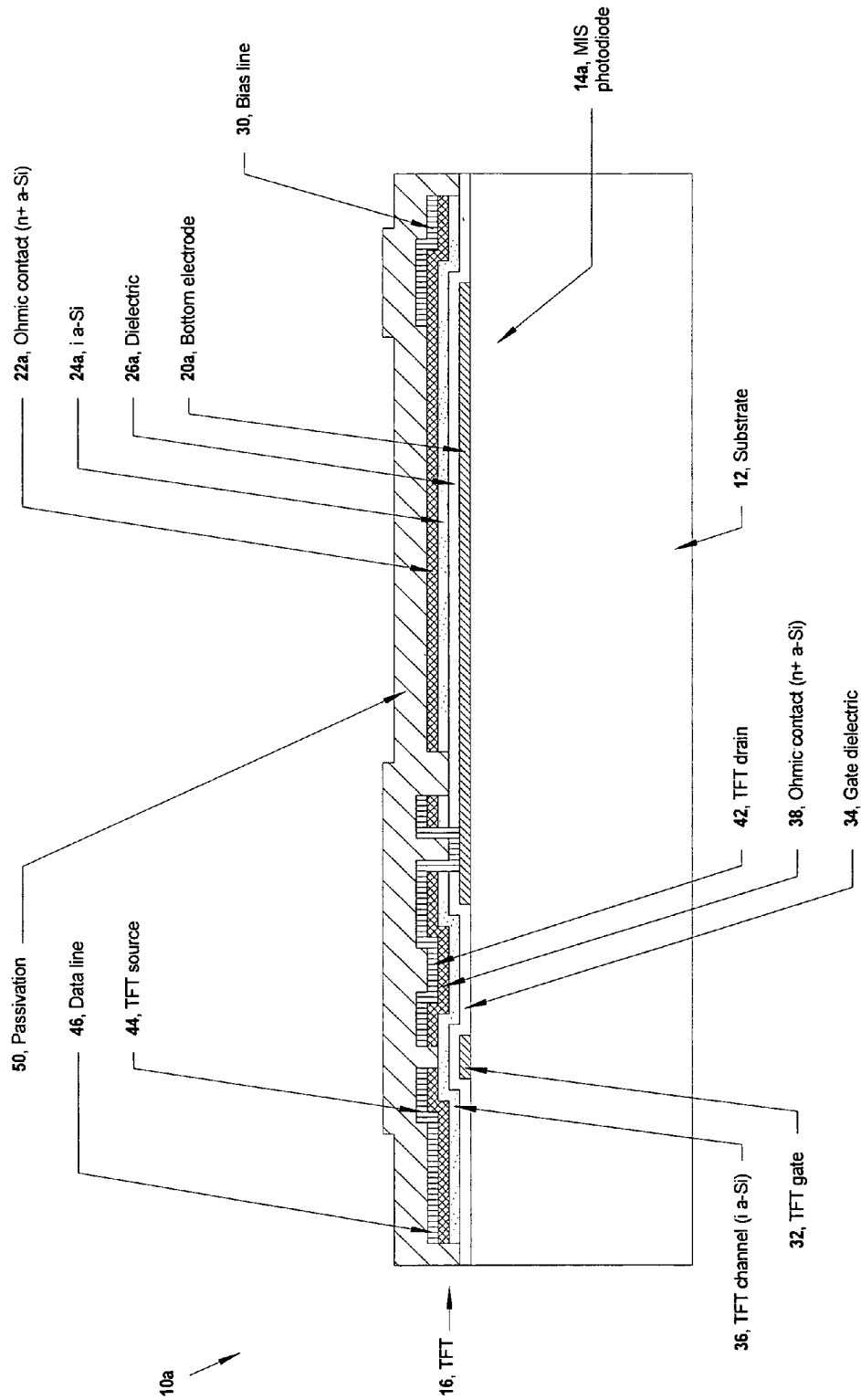
FIG. 1 is a cross section view of a conventional pixel circuit using a MIS photodiode.
Figure 2:
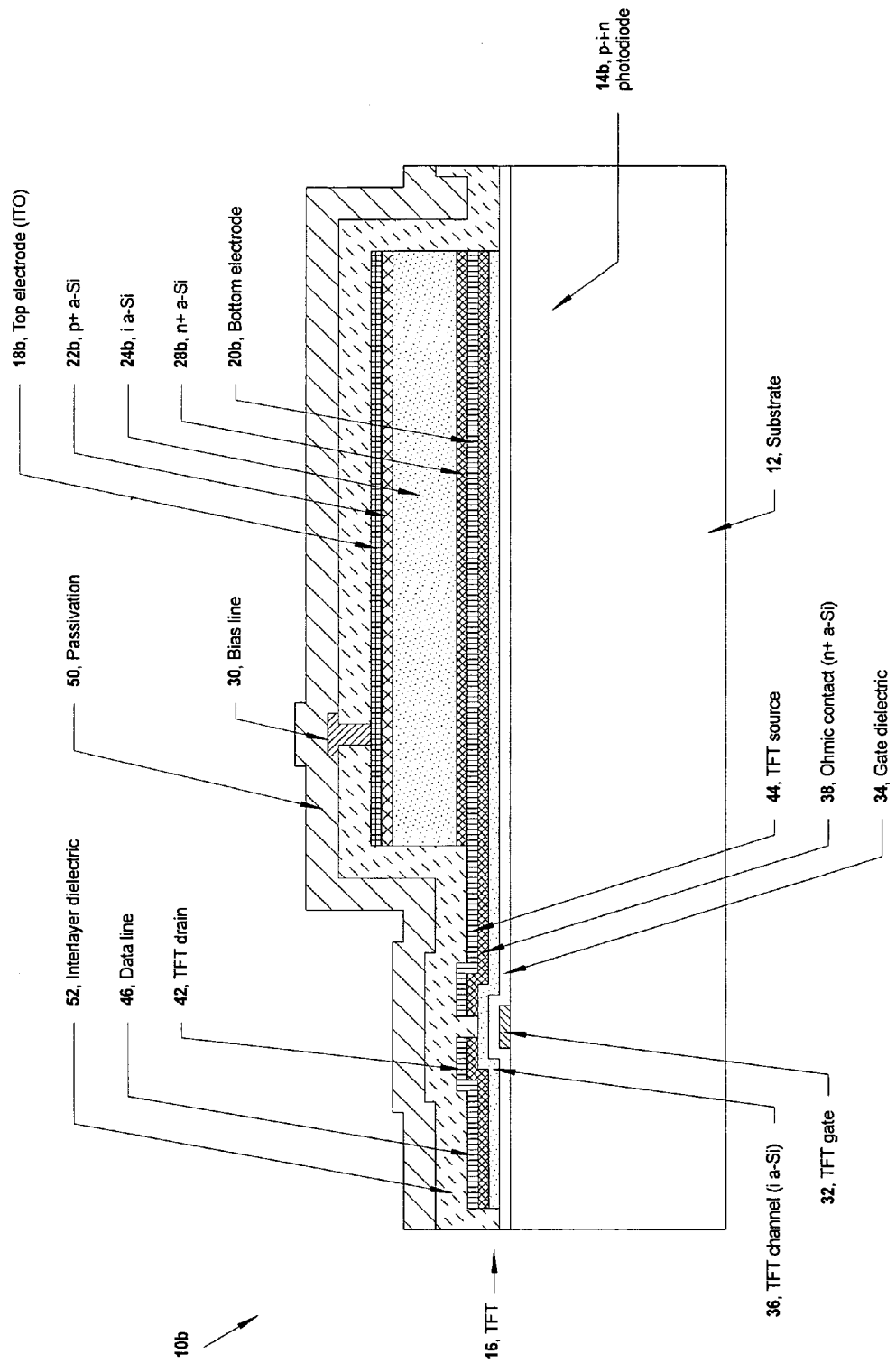
FIG. 2 is a cross section view of a conventional pixel circuit using a p-i-n photodiode.
Figure 3:
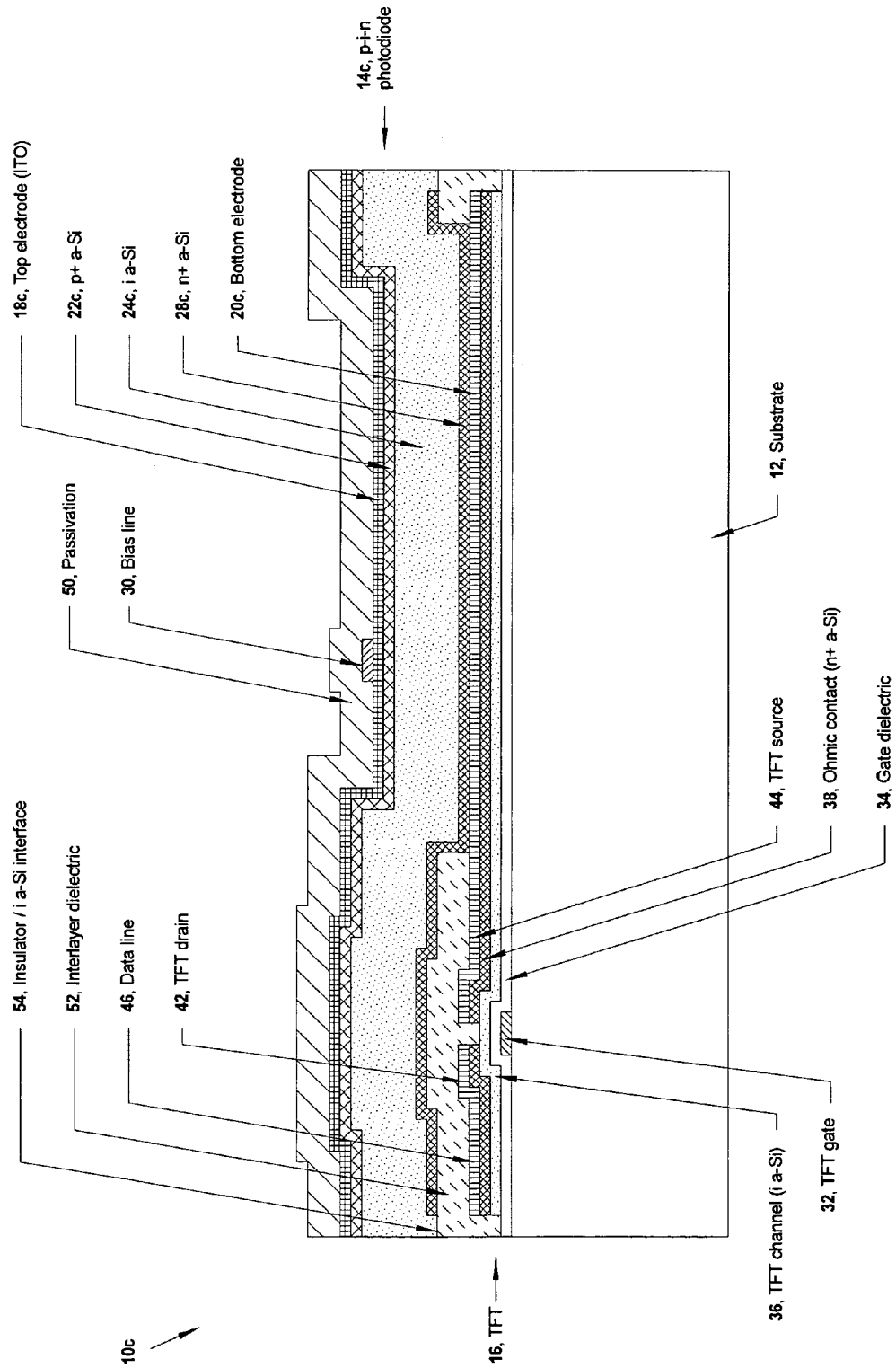
FIG. 3 is a cross section view of another conventional pixel circuit using a p-i-n photodiode.
Figure 6:
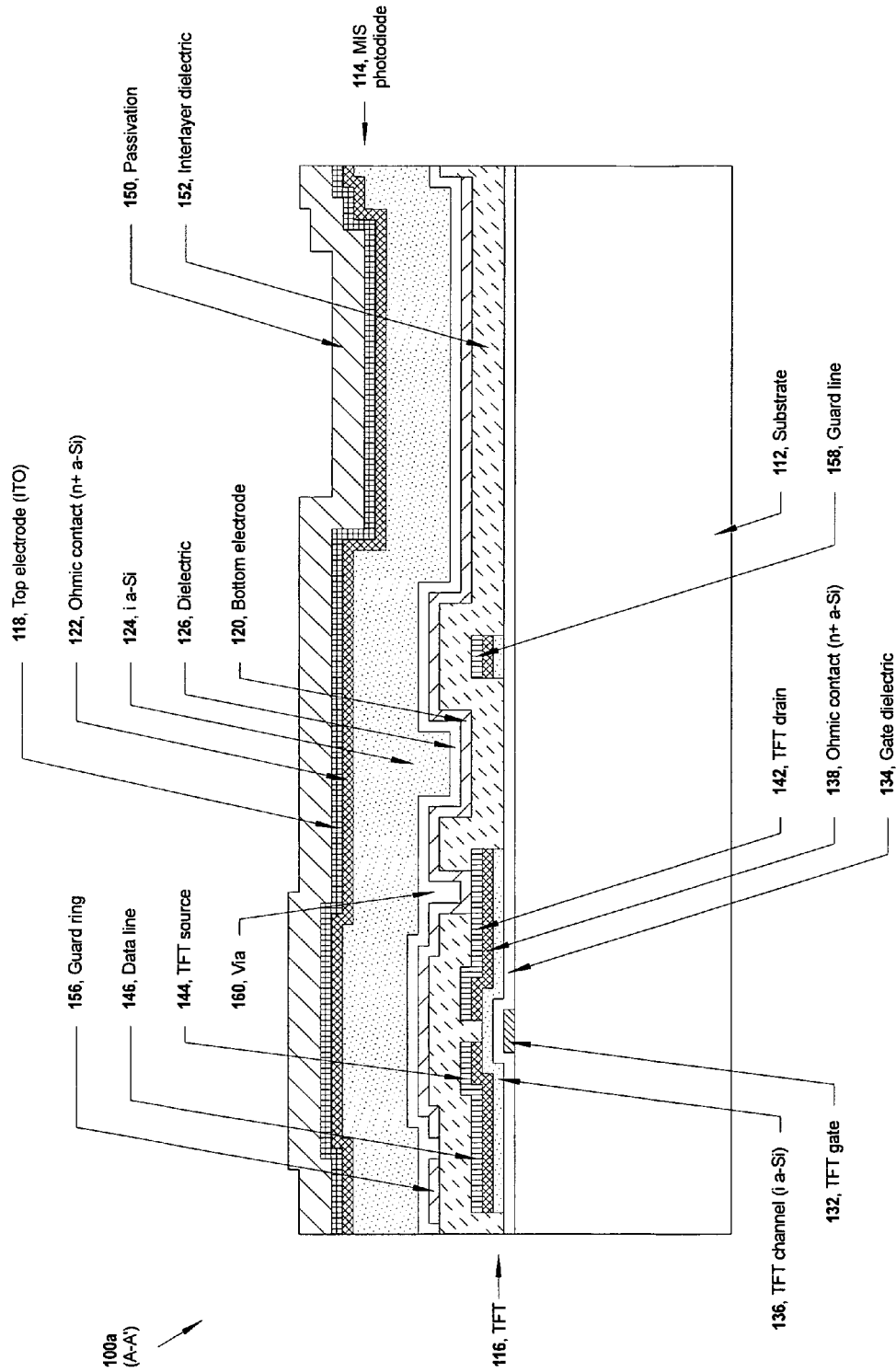
FIG. 6 is a cross section view along line A-A' of FIG. 5.

Referring to FIG. 6, a cross section view along line A-A' of FIG. 5 illustrates the structure of the TFT 116 and MIS photodiode 114. The structure of the TFT 116 is substantially the same as that for the conventional pixel circuits 10a, 10b, 10c of FIGS. 1, 2 and 3. Immediately above the substrate 112 (the primary role of which is that of a base, support or foundation for the remaining layers of materials), the guard line 158 is created from the patterned amorphous silicon 136, 138 and conductive 142 layers which are also used to form portions of the TFT 116. Above the guard line 158 and TFT 116 is an interlayer dielectric material 152 through which a via 160 is formed to allow contact between the bottom electrode 120 of the MIS photodiode 114 and the drain terminal 142 of the TFT 116. The layer of material used to form the bottom electrode 120 is patterned so as to also form the guard ring 156. Next is a layer of dielectric 126, followed by a layer 124 of intrinsic amorphous silicon, the light absorbing layer. Next is a layer 122 of n+ amorphous silicon to form the ohmic contact to the optically transparent conductive layer 118 above. The conductive layer 118 forms the top electrode of the MIS photodiode 114. Lastly is a layer 150 of passivation.

Figure 7:
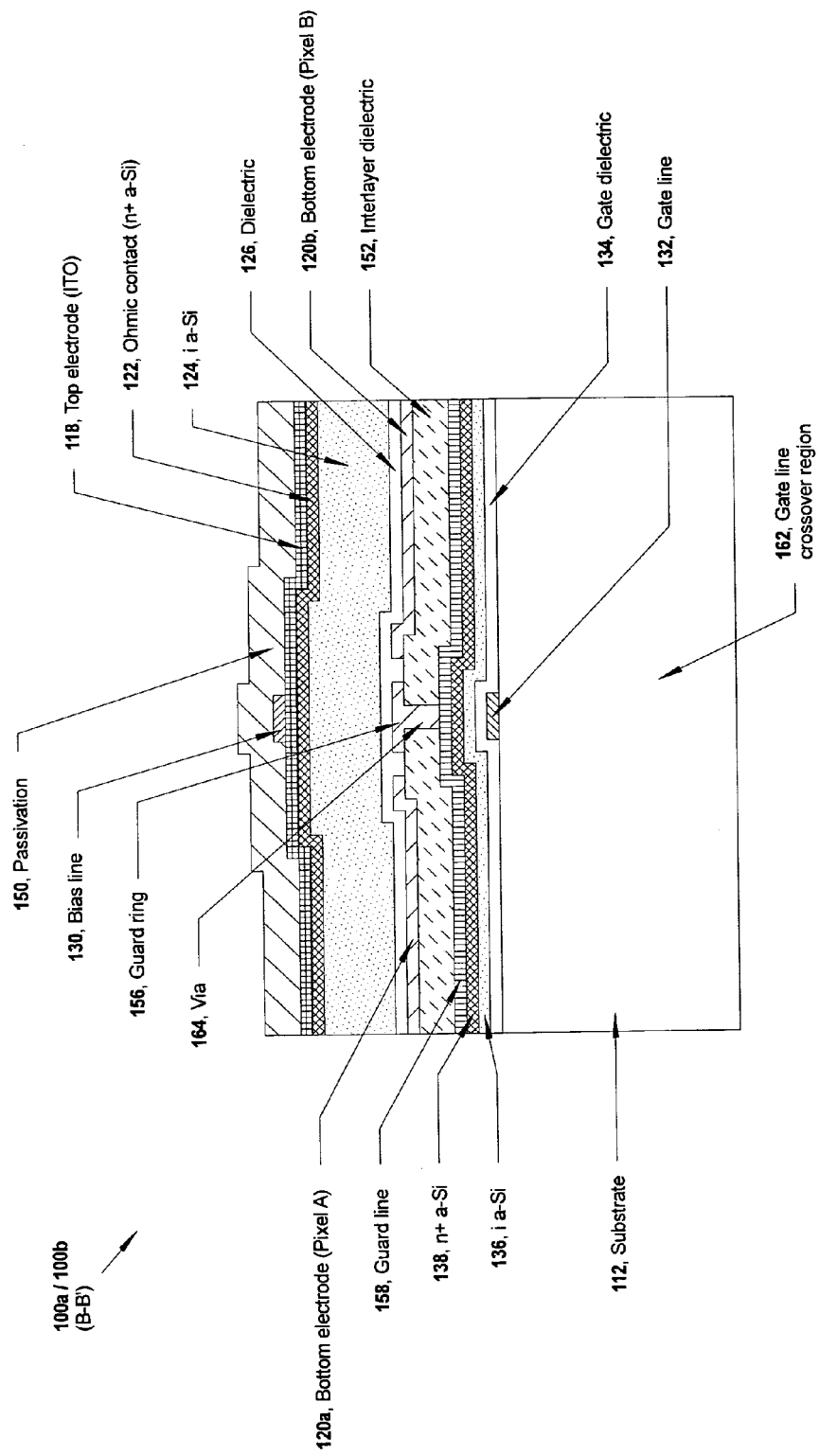
FIG. 7 is a cross section view along line B-B' of FIG. 5.

Referring to FIG. 7, a cross section view along line B-B' of FIG. 5 illustrates the structure of the gate line crossover region 162 between adjacent pixels 100a, 100b. Through this region 162 passes the bias line 130, gate line 132, guard ring 156, and guard line 158. The guard ring 156 is patterned from the same layer of material used to form the bottom electrodes 120a, 120b of the adjacent pixel circuits 100a, 100b. The guard ring 156 makes contact to the guard line 158 through a via 164 formed in the interlayer dielectric 152.

Based upon the foregoing, it can be seen that the pixel circuit 100 of FIG. 4, when implemented as shown in FIGS. 5, 6 and 7, uses a MIS photodiode 114 formed substantially of continuous films. In particular, the insulator 126, semiconductors 122 and 124, and electrode 118 portions of the photodiode structure are continuous. The metal portion of the structure is patterned such that each pixel includes a bottom electrode 120 bordered, e.g., surrounded, by a guard ring 156 which serves to diminish crosstalk between adjacent pixels.

Figure 8:
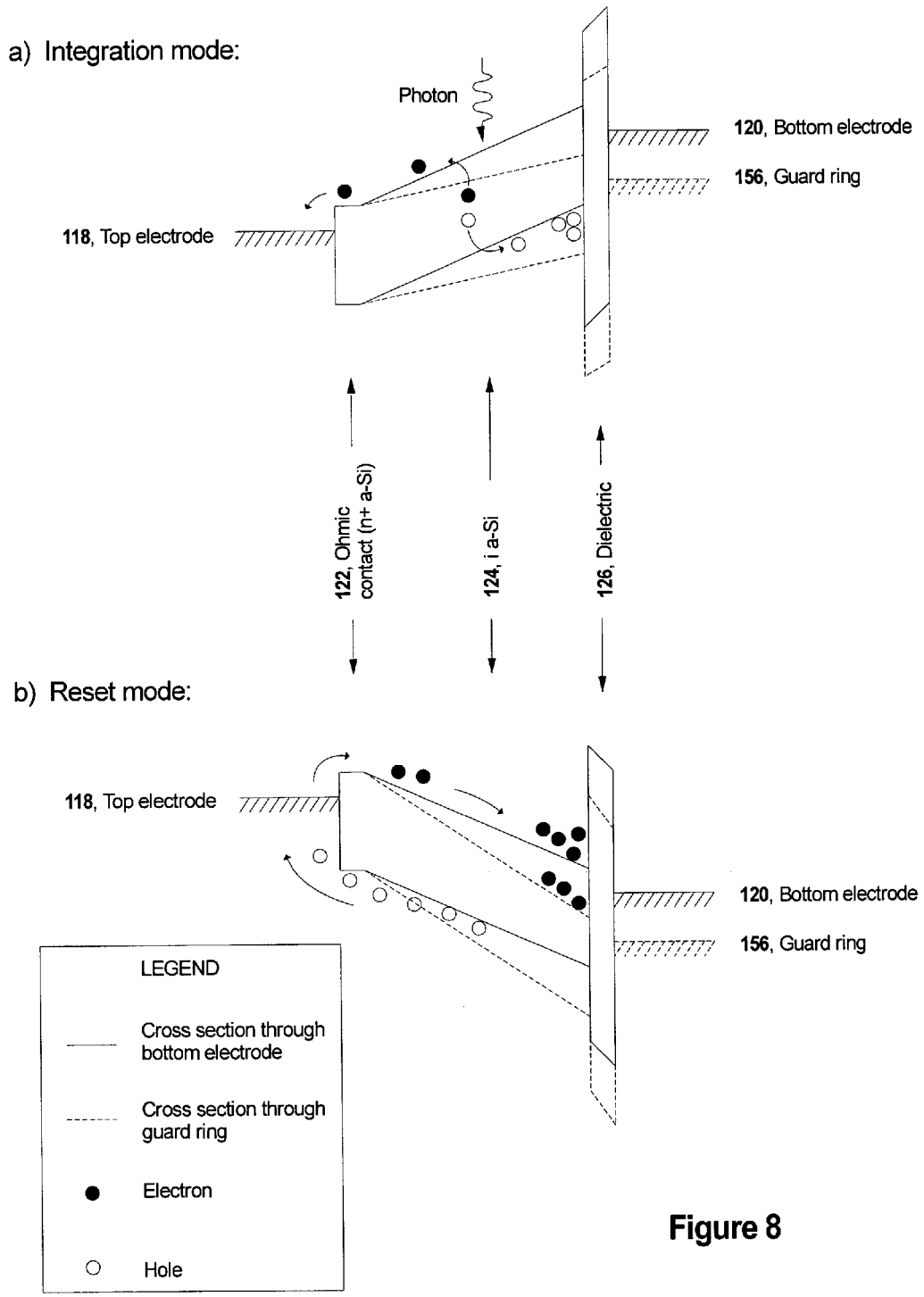
FIG. 8 is a diagram depicting the energy bands associated with the integration and reset operations performed by the pixel circuit of FIG. 4.

Referring to FIG. 8, a pixel circuit in accordance with the presently claimed invention operates (at least in part) as follows. In the integration mode of operation, the top electrode 118 has a potential which is positive compared to the potential of the bottom electrode 120. When light impinges upon the intrinsic layer 124, the light is absorbed and electron-hole pairs are generated. By reason of the electric field between the electrodes 118 and 120, the generated electrons are then introduced to the top electrode 118, and the holes move within the intrinsic layer 124 to reach an interface of the insulating, or dielectric, layer 126. However, the holes cannot move into the insulating layer 126 and therefore remain within the intrinsic layer 124. The hole charge which accumulates at the semiconductor/insulator interface as a result of the absorption of the incident light constitutes the signal of the pixel circuit.

During the reset mode of operation, the top electrode 118 has a potential which is negative compared to the potential of the bottom electrode 120. Electrons are injected by the electrode 118 into the ohmic contact semiconductor layer 122 and subsequently into the intrinsic semiconductor layer 124. The injected electrons travel to the interface between the semiconductor layer 124 and the dielectric layer 126 and recombine with the holes at that interface. The holes remaining in the intrinsic layer 124 are introduced to the top electrode 118.

The guard ring 156 has a potential which is positive compared to the bottom electrode 120. This produces a potential barrier to the hole signal charges which accumulate above the bottom electrode 120 during the integration mode of operation. This potential barrier inhibits, if not prevents, crosstalk between adjacent pixels.

Figure 9:
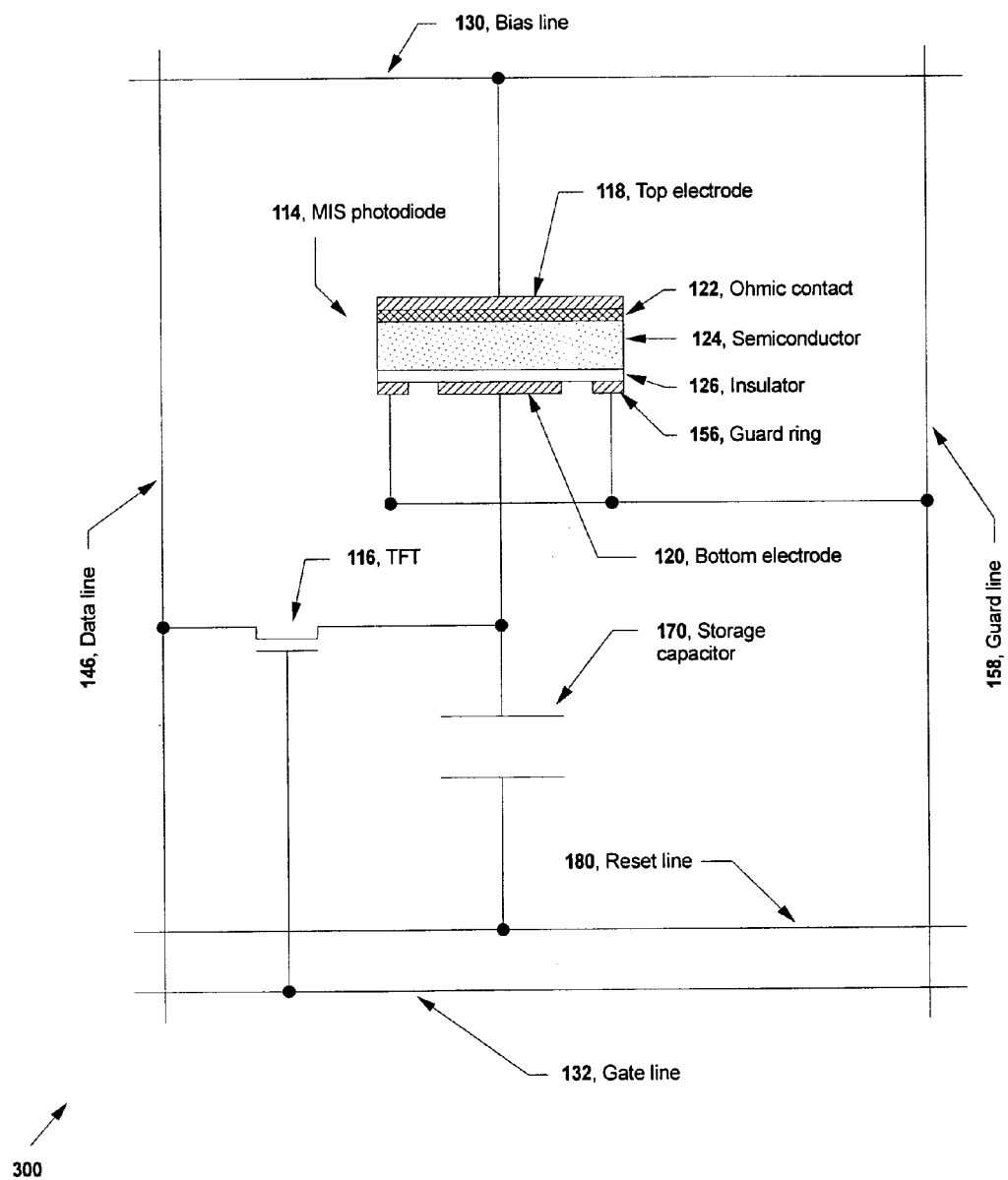
FIG. 9 is a schematic diagram of a pixel circuit in accordance with another embodiment of the presently claimed invention.

Referring to FIG. 9, a pixel circuit 300 in accordance with another embodiment of the presently claimed invention includes the MIS photodiode 114 and TFT 116 connected to the bias line 130, gate line 132, data line 146 and guard line 158, just as in the embodiment of FIG. 4, but also includes a storage capacitor 170 and a reset line 180. These additional elements provide for increased signal handling capacity and an additional reset mechanism. Regarding the former, while the thick semiconductor layer 124 used in the MIS photodiode 114 yields maximum light absorption, it can also result in low capacitance for the photodiode, and therefore limited charge handling capacity. This is solved by the introduction of the storage capacitor 170 which is designed to have high capacitance, and therefore large charge handling capacity. Regarding the latter, in the embodiment of FIG. 4, the imager is reset by pulsing the bias line 130 to a negative voltage relative to the voltage of the bottom electrode 120 (which is nominally at the voltage of the data line 146). In this alternative embodiment 300, the MIS photodiode 114 can now be reset by pulsing the reset line 180 to a sufficiently positive voltage relative to the bias line 130.

Figure 10:
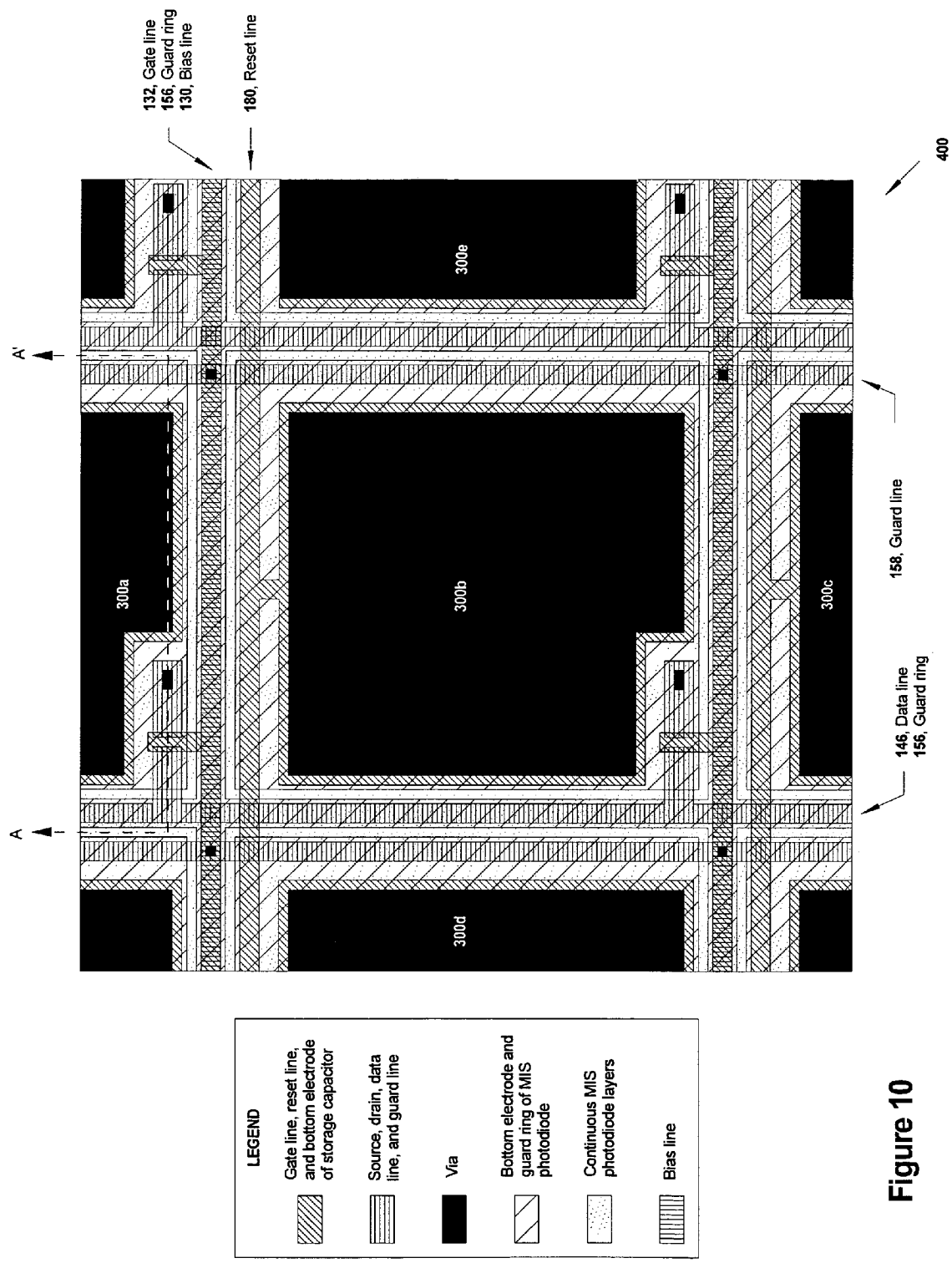
FIG. 10 is a plan view of a portion of an integrated circuit containing pixel circuits corresponding to the schematic of FIG. 9.

Referring to FIG. 10, a plan view of a portion 400 of an integrated circuit containing pixel circuits implemented according to the pixel circuit 300 of FIG. 9 illustrates a pixel circuit 300b with adjacent pixel circuits 300a, 300c, 300d, 300e above, below, to the left and to the right, respectively.

Figure 11:
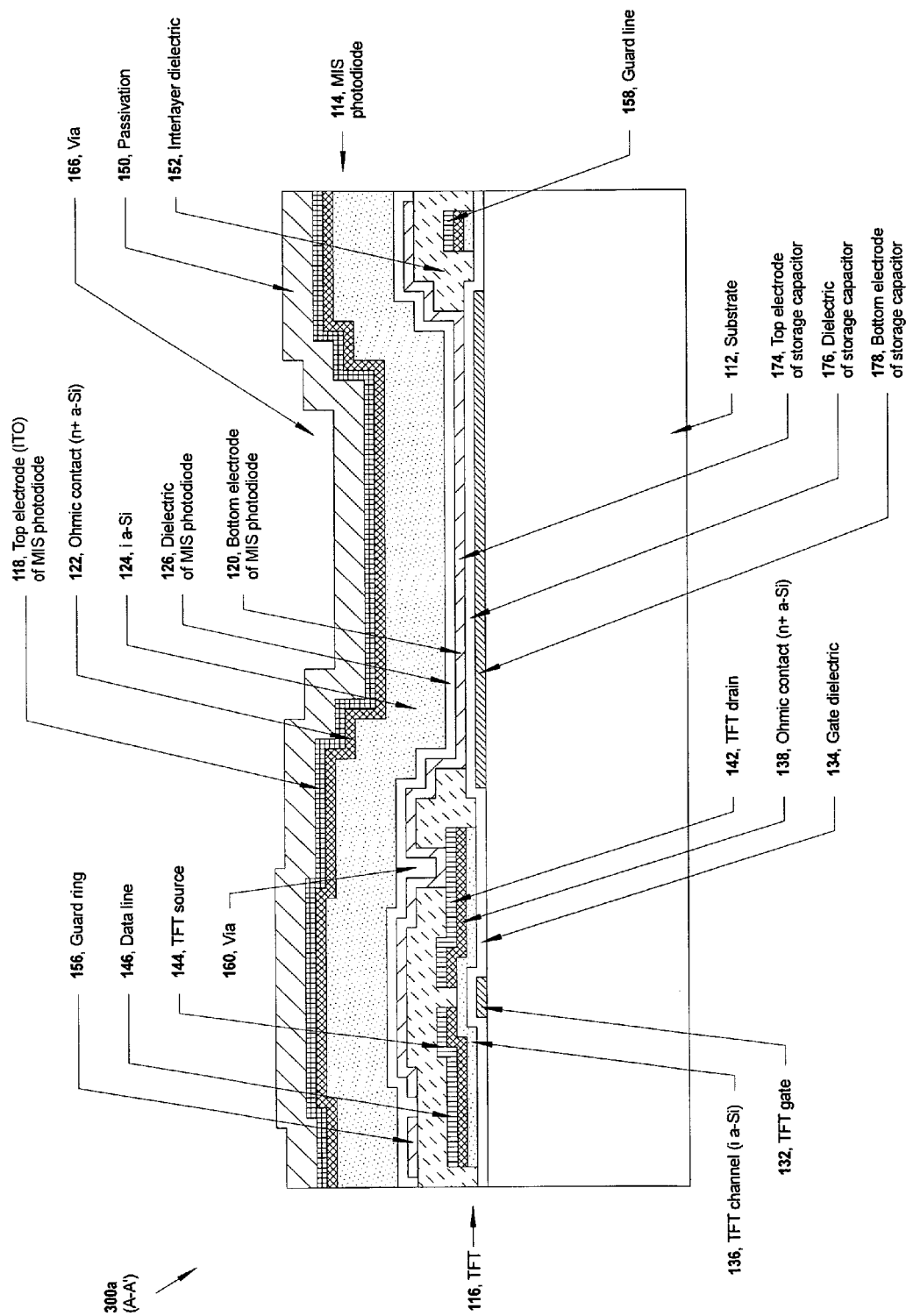
FIG. 11 is a cross section view along line A-A' of FIG. 10.

Referring to FIG. 11, a cross section view along line A-A' of FIG. 10 illustrates the structure of the TFT 116 and MIS photodiode 114. The structure of the TFT 116 is substantially the same as that for the conventional pixel circuits 10a, 10b, 10c of FIGS. 1, 2 and 3. Immediately above the substrate 112, the bottom electrode 178 of the storage capacitor 170 is formed from the patterned layer of conductive material also used to form the gate terminal 132 of the TFT 116. Next is the dielectric 176 of the storage capacitor 170 which also serves as the gate dielectric 134 of the TFT 116. The guard line 158 is created from the patterned amorphous silicon 136, 138 and conductive 142 layers which are also used to form various other portions of the TFT 116. Above the guard line 158 and TFT 116 is an interlayer dielectric material 152 through which vias 160 and 166 are formed. The via 160 allows contact between the bottom electrode 120 of the MIS photodiode 114 and the drain terminal 142 of the TFT 116. The via 166 allows contact of the bottom electrode 120 of the MIS photodiode 114 with the dielectric 176 of the storage capacitor 170, thereby forming the top electrode 174 of the storage capacitor 170. The layer of material used to form the bottom electrode 120 of the MIS photodiode 114 is patterned to also form the guard ring 156. Above the patterned material layer forming the bottom electrode 120 and the guard ring 156 of the MIS photodiode 114 is a layer of dielectric 126, followed by a layer 124 of intrinsic amorphous silicon, the light absorbing layer. Next is a layer 122 of n+ amorphous silicon to form the ohmic contact to the optically transparent conductive layer 118 above. The conductive layer 118 forms the top electrode of the MIS photodiode 114. Lastly is a layer 150 of passivation.

Figure 12:
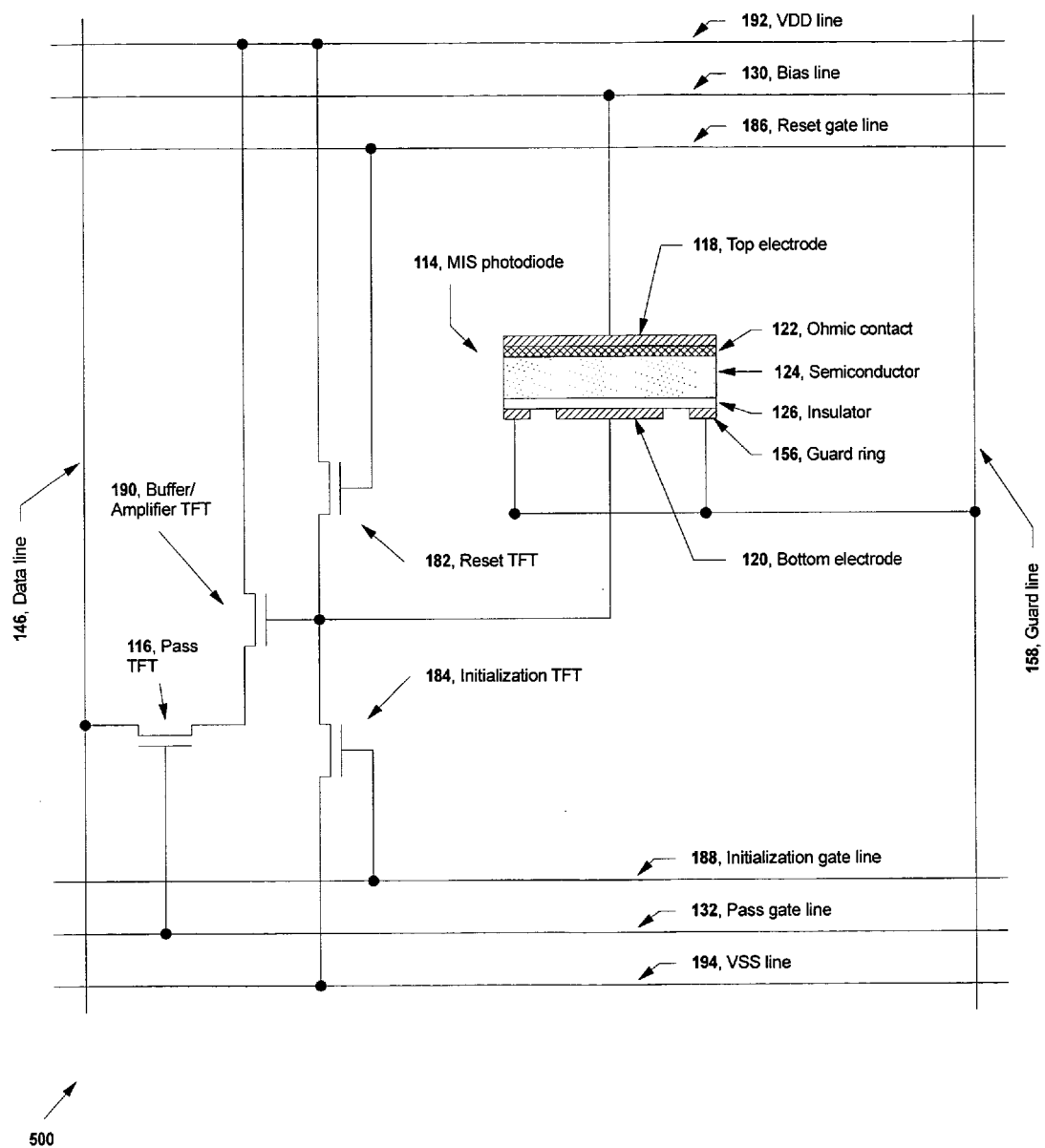
FIG. 12 is a schematic diagram of a pixel circuit in accordance with yet another embodiment of the presently claimed invention.

Referring to FIG. 12, a pixel circuit 500 in accordance with another embodiment of the presently claimed invention includes the MIS photodiode 114 and the pass TFT 116 connected to the bias line 130, pass gate line 132, data line 146 and guard line 158, just as in FIG. 4, but also includes a buffer/amplifier TFT 190, a reset TFT 182, an initialization TFT 184, a reset gate line 186, an initialization gate line 188, a VDD line 192, and a VSS line 194. The buffer/amplifier TFT 190 may operate in either a voltage or a current output mode, depending on how the data line 146 is terminated. The reset TFT 182 clears the MIS photodiode 114 of all signal charge after integration mode, and the initialization TFT 184 sets the potential of the bottom electrode 120 of the MIS photodiode 114 prior to the integration mode. The pixel circuit 500 is an example of a class of pixel circuits known as "active" pixel circuits, which are defined as pixel circuits that contain amplifiers.

Figure 13:
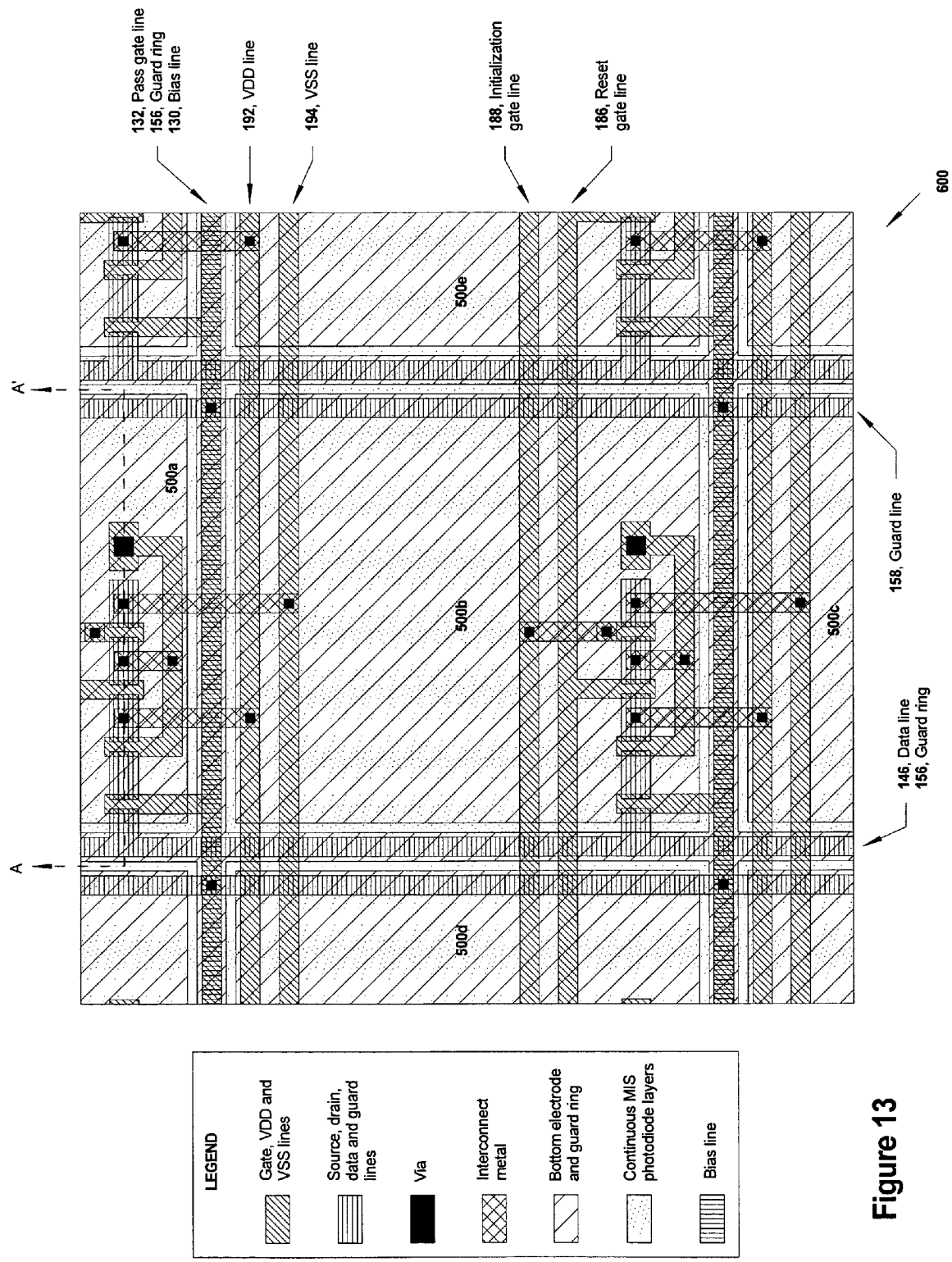
FIG. 13 is a plan view of a portion of an integrated circuit containing pixel circuits corresponding to the schematic of FIG. 12.

Referring to FIG. 13, a plan view of a portion 600 of an integrated circuit containing pixel circuits implemented according to the pixel circuit 500 of FIG. 12 illustrates a pixel circuit 500b with adjacent pixel circuits 500a, 500c, 500d, 500e above, below, to the left and to the right, respectively.

Figure 14:
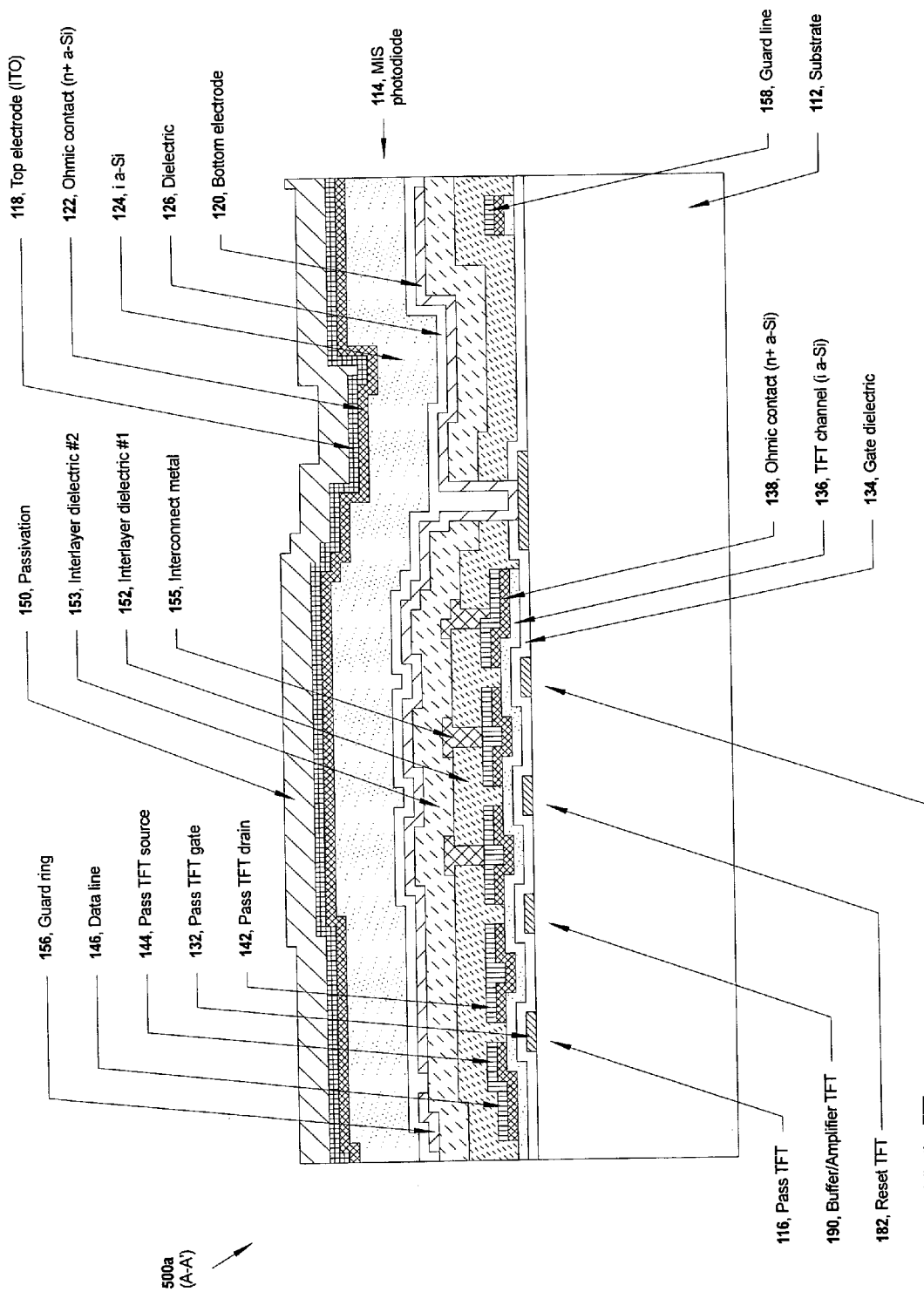
FIG. 14 is a cross section view along line A-A' of FIG. 13.

Referring to FIG. 14, a cross section view along line A-A' of FIG. 13 illustrates the structure of the MIS photodiode 114, the pass TFT 116, the buffer/amplifier TFT 190, the reset TFT 182, and the initialization TFT 184. The structure of all TFTs is substantially the same as that for the TFT in the conventional pixel circuits 10a, 10b, and 10c of FIGS. 1, 2, and 3. Immediately above the substrate 112, the guard line 158 is created from the patterned amorphous silicon 136, 138 and conductive 142 layers which are also used to form portions of the TFTs. Above the guard line 158 and TFTs is a first interlayer dielectric material 152 through which via holes are formed to allow a patterned layer of metal to interconnect the circuit elements. Above the interconnect metal is a second interlayer dielectric material 153. A via hole through both interlayer dielectric films 152 and 153 allows the bottom electrode 120 of the MIS photodiode 114 to make contact to a metal pad which in turn connects (not shown) to the gate of the buffer/amplifier TFT 190. The layer of material used to form the bottom electrode 120 of the MIS photodiode 114 is patterned to also form the guard ring 156. Above the patterned material layer forming the bottom electrode 120 and the guard ring 156 of the MIS photodiode 114 is a layer of dielectric 126, followed by a layer 124 of intrinsic amorphous silicon, the light absorbing layer. Next is a layer 122 of n+ amorphous silicon to form the ohmic contact to the optically transparent conductive layer 118 above. The conductive layer 118 forms the top electrode of the MIS photodiode 114. Lastly is a layer 150 of passivation.

Based upon the foregoing, it should be understood that a MIS photodiode 114 in accordance with the presently claimed invention advantageously has a higher pixel fill-factor than both mesa-isolated MIS and p-i-n photodiodes, thereby producing greater signal levels. A MIS photodiode 114 provides further improvement over the mesa-isolated MIS photodiode structure by allowing the light absorbing semiconductor layer 124 to be optimized for maximum light absorption, and thereby maximum signal generation, without regard to the impact of such film thickness optimization on TFT performance.

Further still, the use of guard rings which border, e.g., substantially surround, the bottom electrode advantageously reduce, if not eliminate, the crosstalk between adjacent pixels which is common in photodiode structures comprised substantially of continuous films.

Moreover, a MIS photodiode structure in accordance with the presently claimed invention using continuous films can potentially reduce manufacturing costs as compared to mesa-isolated and continuous film types of p-i-n photodiode structures. Without a requirement for p-type amorphous silicon material, a MIS photodiode structure in accordance with the presently claimed invention can be produced using the same manufacturing facilities that are used to produce standard TFT backplanes for liquid crystal displays (LCDs). Such manufacturing facilities benefit from high volume, and should, therefore, yield products at lower costs.

In another embodiment of the presently claimed invention which will prove advantageous under suitable conditions, the bias lines 130 are eliminated (see FIGS. 4–5, 7, 9–10 and 12–13). If the active area of the imager is sufficiently small, and if the sheet resistance of the continuous top electrode 118 can be made sufficiently low, then it will not be necessary to have bias lines 130 which address every pixel in the image sensor array. Rather, a global bias connection can be made to the top electrode 118 at the periphery of the array. Since the bias lines 130 are the only structures which obscure light that impinges on the MIS photodiodes 114, the elimination of the bias lines 130 should result in pixels with near unity fill-factor. Elimination of the bias lines 130 should also lead to higher yield in the manufacturing process.

In another embodiment of the presently claimed invention which will prove advantageous under suitable conditions, the optically transparent conductive material (e.g., ITO) generally used to form the top electrode 118 is eliminated (see FIGS. 6–7, 11 and 14). If the active area of the imager is sufficiently small, and if the sheet resistance of the n+ amorphous silicon semiconductor layer 122 is sufficiently low, then the n+ amorphous silicon semiconductor layer 122 may also serve as the top electrode 118. Elimination of the optically transparent conductive material should lead to higher yield in the manufacturing process.

In another embodiment of the presently claimed invention which will prove advantageous under suitable conditions, the guard lines 158 are eliminated (see FIGS. 4–7, 9–11 and 12–14). If the active area of the imager is sufficiently small, and if the sheet resistance of the guard ring lattice structure 156 can be made sufficiently low, then it will not be necessary to have guard lines 158 which address every pixel in the image sensor array. Rather, a global connection can be made to the guard ring lattice structure 156 at the periphery of the array. Elimination of the guard lines 158 should lead to higher yield in the manufacturing process.

In another embodiment of the presently claimed invention which may prove advantageous, additional dielectric layers are incorporated between the dielectric layer 126 and the semiconductor layer 124 (see FIGS. 4, 6–7, 9, 11–12 and 14). The dielectric material between the bottom electrodes 120 and the continuous semiconductor layer 124 must serve several purposes. This dielectric material must have sufficient thickness and structural integrity to not breakdown under the electric fields established between the bottom electrodes 120 and the continuous top electrode 118. This dielectric material must be sufficiently free of internal stresses so as to not warp the underlying substrate 12. This dielectric material must also form an interface with the continuous semiconductor layer 124 which minimizes electron and hole trap states (trap states lead to image lag problems; i.e., ghost images). It may be that no one continuous dielectric layer 126 can adequately satisfy all these requirements.

In another embodiment of the presently claimed invention which may prove advantageous, the guard ring 156 is formed from one or more layers of conductive material different from that used to form the bottom electrode 120 of the MIS photodiode 114 (See FIGS. 5–7, 10–11 and 13–14). This may be done, for example, to create a guard ring structure 156 which yields reduced parasitic capacitance of the data line 146 which is located underneath a portion of the guard ring 156. It is desirable to minimize the parasitic capacitance of the data line 146 as such capacitance can yield noise in the imaging process (particularly for the pixel circuits of FIGS. 4 and 9). A guard ring structure 156 which yields reduced data line 146 parasitic capacitance may be created subsequent to the formation of the bottom electrode 120, for example, by the deposition of additional dielectric material followed by the deposition of additional conductive material and then patterning these two layers to yield a guard ring 156 which is located vertically above the bottom electrode 120. The additional separation of the guard ring 156 from the data line 146 yields reduced parasitic capacitance of the data line 146.

In another embodiment of the presently claimed invention, a p+amorphous silicon layer is used as the doped amorphous silicon layer 122 which is in contact with the top electrode 118 of the MIS photodiode 114 (See FIGS. 4, 6–9, 11–12 and 14). In this case, all bias polarities would be the opposite of those in the description above, and the signal carriers would be electrons.

In further embodiments of the presently claimed invention, alternative materials can be used for any portion of the device structure. For example, organic electronic materials which have conducting, semiconducting, and insulating properties could replace the inorganic electronic materials with corresponding properties in the description above. For an embodiment employing organic electronic materials, the relative positions of the various material layers and the polarities of the signal carrier and operating voltages may change. Such changes may be necessary since organic TFTs typically have the gate electrode located vertically above the source and drain electrodes rather than beneath, and organic semiconducting materials are typically p-type rather than n-type. Nevertheless, the basic configuration of an MIS photodiode using continuous films and employing a guard ring, with remaining pixel circuitry underneath, may potentially be implemented using organic electronic materials.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated photosensitive device, comprising:
   a substrate; and
   a metal-insulator-semiconductor (MIS) photodiode at least a portion of which is disposed over said substrate and comprising
      first and second electrodes,
      one or more dielectrics at least a portion of at least one of which is disposed between said first and second electrodes, wherein at least one of said one or more dielectric portions comprises a respective at least substantially continuous layer of dielectric material,
      one or more semiconductors at least a portion of at least one of which is disposed between one of said one or more dielectrics and one of said first and second electrodes, wherein at least one of said one or more semiconductor portions comprises a respective at least substantially continuous layer of semiconductor material, and
      a third electrode at least substantially bordering one of said first and second electrodes.

2. The apparatus of claim 1, wherein one of said first and second electrodes comprises an at least substantially continuous electrode disposed at least substantially proximate one of said at least one of said one or more semiconductor portions.

3. The apparatus of claim 1, further comprising one or more thin film transistors (TFTs) coupled to said MIS photodiode.

4. The apparatus of claim 3, wherein:
   at least one of said one or more TFTs includes a channel region having a thickness; and
   at least one of said one or more MIS photodiode semiconductor portions has a thickness greater than said at least one TFT channel region thickness.

5. The apparatus of claim 4, wherein said at least one of said one or more MIS photodiode semiconductor portions having a thickness greater than said at least one TFT channel region thickness comprises an at least substantially continuous layer of said semiconductor material.

6. The apparatus of claim 3, wherein at least one of said one or more TFTs is disposed at least substantially between said MIS photodiode and said substrate.

7. The apparatus of claim 1, wherein at least one of said one or more MIS photodiode semiconductor portions comprises n-type amorphous silicon (a-Si).

8. An apparatus including an integrated photosensitive device, comprising:
   a substrate; and
   a metal-insulator-semiconductor (MIS) photodiode at least a portion of which is disposed over said substrate and comprising
      a plurality of conduction layers including at least first and second conduction layers comprising first and second films of conductive material, respectively,
      one or more insulation layers at least a portion of at least one of which is disposed between said first and second conduction layers, wherein at least one of said one or more insulation layer portions comprises a respective at least substantially continuous film of insulation material, and
      one or more semiconductor layers at least a portion of at least one of which is disposed between one of said one or more insulation layers and one of said first and second conduction layers, wherein at least one of said one or more semiconductor layer portions comprises a respective at least substantially continuous film of semiconductor material,
      wherein one of said first and second conduction layers includes a first portion, one of said plurality of conduction layers includes a second portion, said first and second portions are mutually isolated, and said first portion is at least substantially bordered by said second portion.

9. The apparatus of claim 8, wherein one of said first and second conduction layers comprises an at least substantially continuous conduction layer disposed at least substantially proximate one of said at least one of said one or more semiconductor layer portions.

10. The apparatus of claim 8, further comprising one or more thin film transistors (TFTs) coupled to said MIS photodiode.

11. The apparatus of claim 10, wherein:
   at least one of said one or more TFTs includes a channel region having a thickness; and
   at least one of said one or more MIS photodiode semiconductor layer portions has a thickness greater than said at least one TFT channel region thickness.

12. The apparatus of claim 11, wherein said at least one of said one or more MIS photodiode semiconductor layer portions having a thickness greater than said at least one TFT channel region thickness comprises an at least substantially continuous film of said semiconductor material.

13. The apparatus of claim 10, wherein at least one of said one or more TFTs is disposed at least substantially between said MIS photodiode and said substrate.

14. The apparatus of claim 8, wherein at least one of said one or more MIS photodiode semiconductor layer portions comprises n-type amorphous silicon (a-Si).

15. An apparatus including an integrated photosensitive array, comprising:
   a substrate; and
   a plurality of metal-insulator-semiconductor (MIS) photodiodes at least a portion of which is disposed in an array over said substrate with each one of said at least a portion of said plurality of MIS photodiodes comprising
      first and second electrodes,
      one or more dielectrics at least a portion of at least one of which is disposed between said first and second electrodes, wherein at least one of said one or more dielectric portions comprises a respective at least substantially continuous layer of dielectric material, one or more semiconductors at least a portion of at least one of which is disposed between one of said one or more dielectrics and one of said first and second electrodes, wherein at least one of said one or more semiconductor portions comprises a respective at least substantially continuous layer of semiconductor material, and a third electrode at least substantially bordering one of said first and second electrodes.

16. The apparatus of claim 15, wherein one of said first and second electrodes comprises an at least substantially continuous electrode disposed at least substantially proximate one of said at least one of said one or more semiconductor portions.

17. The apparatus of claim 15, further comprising a plurality of thin film transistors (TFTs) coupled to said plurality of MIS photodiodes.

18. The apparatus of claim 17, wherein:
each one of at least a portion of said plurality of TFTs includes a respective channel region having a thickness; and
at least one of said one or more MIS photodiode semiconductor portions in each one of said plurality of MIS photodiodes has a thickness greater than a respective one of said plurality of TFT channel region thicknesses.

19. The apparatus of claim 18, wherein said at least one of said one or more MIS photodiode semiconductor portions in each one of said plurality of MIS photodiodes having a thickness greater than a respective one of said plurality of TET channel region thicknesses comprises an at least substantially continuous layer of said semiconductor material.

20. The apparatus of claim 17, wherein each one of at least a portion of said plurality of TFTs is disposed at least substantially between a respective one of said at least a portion of said plurality of said MIS photodiodes and said substrate.

21. The apparatus of claim 15, wherein at least one of said one or more MIS photodiode semiconductor portions comprises n-type amorphous silicon (a-Si).

22. An apparatus including an integrated photosensitive device, comprising:
a substrate; and
a metal-insulator-semiconductor (MIS) photodiode at least a portion of which is disposed over said substrate and comprising
first and second electrodes,
one or more dielectrics at least a portion of at least one of which is disposed between said first and second electrodes,
one or more semiconductors at least a portion of at least one of which is disposed between one of said one or more dielectrics and one of said first and second electrodes, and
a third electrode at least substantially bordering one of said first and second electrodes.

23. The apparatus of claim 22, further comprising one or more thin film transistors (TFTs) coupled to said MIS photodiode.

24. The apparatus of claim 23, wherein:
at least one of said one or more TFTs includes a channel region having a thickness; and
at least one of said one or more MIS photodiode semiconductor portions has a thickness greater than said at least one TFT channel region thickness.

25. The apparatus of claim 23, wherein at least one of said of or more TFTs is disposed at least substantially between said MIS photodiode and said substrate.

26. The apparatus of claim 22, wherein at least one of said one or more MIS photodiode semiconductor portions comprises n-type amorphous silicon (a-Si).

27. An apparatus including an integrated photosensitive device, comprising:
a substrate; and
a metal-insulator-scmiconductor (MIS) photodiode at least a portion of which is disposed over said substrate and comprising
a plurality of conduction layers including at least first and second conduction layers comprising first and second films of conductive material, respectively,
one or more insulation layers at least a portion of at least one of which is disposed between said first and second conduction layers, and
one or more semiconductor layers at least a portion of at least one of which is disposed between one of said one or more insulation layers and one of said first and second conduction layers.
wherein one of said first and second conduction layers includes a first portion, one of said plurality of conduction layers includes a second portion, said first and second portions are mutually isolated, and said first portion is at least substantially bordered by said second portion.

28. The apparatus of claim 27, further comprising one or more thin film transistors (TFTs) coupled to said MIS photodiode.

29. The apparatus of claim 28, wherein:
at least one of said one or more TFTs includes a channel region having a thickness; and
at least one of said one or more MIS photodiode semiconductor layer portions has a thickness greater than said at least one TET channel region thickness.

30. The apparatus of claim 28, wherein at least one of said one or more TFTs is disposed at least substantially between said MIS photodiode and said substrate.

31. The apparatus of claim 27, wherein at least one of said one or more MIS photodiode semiconductor layer portions comprises n-type amorphous silicon (a-Si).

32. An apparatus including an integrated photosensitive array, comprising:
a substrate: and
a plural of metal-insulator-semiconductor (MIS) photodiodes at least a portion of which is disposed in an array over said substrate with each one of said at least a portion of said plurality of MIS photodiodes comprising
first and second electrodes,
one or more dielectrics at least a portion of at least one, of which is disposed between said first and second electrodes,
one or more semiconductors at least a portion of at least one of which is disposed between one of said one or more dielectrics and one of said first and second electrodes, and
a third electrode at least substantially bordering one of said first and second electrodes.

33. The apparatus of claim 32, further comprising a plurality of thin film transistors (TFTs) coupled to said plurality of MIS photodiodes.

34. The apparatus of claim 33, wherein:
each one of at least a portion of said plurality of TFTs includes a respective channel region having a thickness; and
at least one of said one or more MIS photodiode semiconductor portions in each one of said plurality of MIS photodiodes has a thickness greater than a respective one of said plurality of TFT channel region thicknesses.

35. The apparatus of claim 33, wherein each one of at least a portion of said plurality of TFTs is disposed at least substantially between a respective one of said at least a portion of said plurality of said MIS photodiodes and said substrate.

36. The apparatus of claim 32, wherein at least one of said one or more MIS photodiode semiconductor portions comprises n-type amorphous silicon (a-Si).

37. An apparatus including an integrated photosensitive array, comprising:
a substrate; and
a plurality of metal-insulator-semiconductor (MIS) photodiodes at least a portion of which is disposed in an array over said substrate, including at least first and second MIS photodiodes disposed mutually adjacently and comprising
first, second and third electrodes,
one or more dielectrics at least a portion of at least one of which is disposed between at least two of said first, second and third electrodes, wherein at least one of said one or more dielectric portions comprises a respective at least substantially continuous layer of dielectric material within at least respective portions of said at least first and second MIS photodiodes,
one or more semiconductors at least a portion of at least one of which is disposed between one of said of one or more dielectrics and at least one of said first, second and third electrodes, wherein at least one of said one or more semiconductor portions comprises a respective at least substantially continuous layer of semiconductor material within said at least respective portions of said at least first and second MIS photodiodes.

38. The apparatus of claim 37, wherein one of said first, second and third electrodes comprises an at least substantially continuous electrode within said at least respective portions of said at least first and second MIS photodiodes and is disposed at least substantially proximate one of said at least one of said one or more semiconductor portions.

39. The apparatus of claim 37, further comprising one or more thin film transistors (TFTs) coupled to each one of said at least first and second MIS photodiodes.

40. The apparatus of claim 39, wherein:
at least one of said one or more TFTs includes a channel region having a thickness; and
at least one of said one or more MIS photodiode semiconductor potions has a thickness greater than said at least one TFT channel region thickness.

41. The apparatus of claim 40, wherein said at least one of said one or more MIS photodiode semiconductor portions having a thickness greater than said at least one TFT channel region thickness comprises an at least substantially continuous layer of said semiconductor material within at least respective portions of said at least first and second MIS photodiodes.

42. The apparatus of claim 39, wherein at least one of said one or more TFTs is disposed at least substantially between said MIS photodiode and said substrate.

43. The apparatus of claim 37, wherein at least one of said one or more MIS photodiode semiconductor portions comprises n-type amorphous silicon (a-Si).

44. The apparatus of claim 37, further comprising a fourth electrode at least substantially bordering at least one of said first, second and third electrodes.

45. An apparatus including an integrated photosensitive device, comprising:
a substrate; and
a plurality of metal-insulator-semiconductor (MIS) photodiodes, at least a portion of which is disposed in an array over said substrate, including at least first and second MIS photodiodes disposed mutually adjacently and comprising
a plurality of conduction layers including at least first and second conduction layers comprising at least first and second films of conductive material, respectively,
one or more insulation layers at least a portion of at least one of which is disposed between said at least first and second conduction layers, wherein at least one of said one or more insulation layer portion comprises a respective at least substantially, continuous film of insulation material within at least respective portions of said at least first and second MIS photodiodes, and
one or more semiconductor layers at least a portion of at least one of which is disposed between one of said one or more insulation layers and one of said first and second conduction layers, wherein at least one of said one or more semiconductor layer portions comprises respective at least substantially continuous film of semiconductor material within said at least respective portions of said at least first and second MIS photodiodes.

46. The apparatus of claim 45, wherein one of said first and second conduction layers comprises an at least substantially continuous conduction layer within said at least respective portions of said at least first and second MIS photodiodes and is disposed at least substantially proximate one of said at least one of said one or more semiconductor layer portions.

47. The apparatus of claim 45, further comprising one or more thin film transistors (TFTs) coupled to each one of said at least first and second MIS photodiodes.

48. The apparatus of claim 47, wherein:
at least one of said one or more TFTs includes a channel region having a thickness; and
at least one of said one or more MIS photodiode semiconductor layer portions has a thickness greater than said at least one TFT channel region thickness.

49. The apparatus of claim 48, wherein said at least one of said one or more MIS photodiode semiconductor layer portions having a thickness greater than said at least one TFT channel region thickness comprises an at least substantially continuous film of said semiconductor material within said at least respective portions of said at least first and second MIS photodiodes.

50. The apparatus of claim 47, wherein at least one of said one or more TFTs is disposed at least substantially between said MIS photodiode and said substrate.

51. The apparatus of claim 45, wherein at least one of said one or more MIS photodiode semiconductor layer of portions comprises n-type amorphous silicon (a-Si).

52. The apparatus of claim 45, wherein one of said first and second conduction layers includes a first portion one of said plurality of conduction layers includes a second portion, said first and second portions are mutually isolated, and said first portion is at least substantially bordered by said second portion.

* * * * *

UNITED STATES PATENT AND TRADEMARK OFFICE
CERTIFICATE OF CORRECTION

PATENT NO. : 7,208,810 B2
APPLICATION NO. : 10/882603
DATED : April 24, 2007
INVENTOR(S) : Michael Dean Wright It is certified that error appears in the above-identified patent and that said Letters Patent is hereby corrected as shown below:

Column 10, claim 11, line 43, please delete "scmi-" and insert --semi- --;

Column 11, claim 19, line 33, please delete "TET" and insert --TFT--;

Column 12, claim 25, line 2, please delete "of or more" and insert --of one or more--;

Column 12, claim 27, line 11, please delete "metal-insulator-scmiconductor" and insert --metal-insulator-semiconductor--;

Column 12, claim 27, line 23, please delete "layers." and insert --layers,--;

Column 12, claim 29, line 38, please delete "TET" and insert --TFT--;

Column 12, claim 32, line 48, please delete "plural" and insert --plurality--;

Column 13, claim 40, line 56, please delete "potions" and insert --portions--;

Column 14, claim 45, line 24, please delete "portion" and insert --portions--;

Column 14, claim 45, line 35, please delete "prises respective" and insert --prises a respective--;

Column 15, claim 51, line 2, please delete "of";

Column 15, claim 52, line 5, please delete "portion one of" and insert --portion, one of--.

Signed and Sealed this

Twelfth Day of June, 2007

JON W. DUDAS
*Director of the United States Patent and Trademark Office*